United States Patent
Chang

(10) Patent No.: US 10,027,357 B2
(45) Date of Patent: Jul. 17, 2018

(54) TRANSMITTER WITH COMPENSATING MECHANISM OF PULLING EFFECT

(71) Applicant: Realtek Semiconductor Corporation, Hsinchu (TW)

(72) Inventor: Yuan-Shuo Chang, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 5 days.

(21) Appl. No.: 15/391,873

(22) Filed: Dec. 28, 2016

(65) Prior Publication Data
US 2017/0194991 A1    Jul. 6, 2017

(30) Foreign Application Priority Data
Dec. 31, 2015  (TW) .............................. 104144713 A

(51) Int. Cl.
| H04K 1/02 | (2006.01) |
| H04B 1/04 | (2006.01) |
| H03F 3/24 | (2006.01) |

(52) U.S. Cl.
CPC ............. H04B 1/0475 (2013.01); H03F 3/24 (2013.01); H04B 2001/0408 (2013.01)

(58) Field of Classification Search
CPC ........ H03F 1/3247; H03F 3/24; H03F 1/3241; H04L 27/368; H04L 1/0003; H04L 1/0071; H04L 5/0007; H04L 1/0009; H04L 27/0008; H03G 3/3042
USPC .................................. 375/297, 295, 316, 219
See application file for complete search history.

(56) References Cited

U.S. PATENT DOCUMENTS

| 4,680,556 A | 7/1987 | Nakamura et al. |
| 6,909,884 B2 | 6/2005 | Sourour et al. |
| 7,856,050 B1 | 12/2010 | Wiss et al. |
| 2009/0268791 A1* | 10/2009 | Waheed .................. H03L 7/099 375/219 |
| 2010/0026395 A1 | 2/2010 | Lane |
| 2012/0184235 A1* | 7/2012 | Peavey ..................... H03L 7/07 455/256 |

FOREIGN PATENT DOCUMENTS

| WO | 2010060953 A1 | 6/2010 |
| WO | 2013056660 A1 | 4/2013 |

OTHER PUBLICATIONS

Ahmad Mirzaei et al., "Pulling Mitigation in Wireless Transmitters," IEEE Journal of Solid-State Circuits, vol. 49, No. 9, Sep. 2014.

* cited by examiner

*Primary Examiner* — Zewdu Kassa
(74) *Attorney, Agent, or Firm* — CKC & Partners Co., Ltd.

(57) ABSTRACT

A transmitter with compensating mechanism of pulling effect includes a correction unit and an output unit. The correction unit includes a memory circuit and a first address generation circuit. The memory circuit is configured to store a look up table, wherein the look up table stores correction data corresponding to an in-phase data signal, a quadrature data signal, and at least one system parameter. The first address generation circuit is configured to generate a first address according to the in-phase data signal, the quadrature data signal, and the at least one system parameter, in order to output a correction signal via the correction data. The output unit is configured to modulate the correction signal according to an oscillating signal to generate a modulated signal, and amplify the modulated signal to generate an output signal.

20 Claims, 7 Drawing Sheets

US 10,027,357 B2

TRANSMITTER WITH COMPENSATING MECHANISM OF PULLING EFFECT

RELATED APPLICATIONS

This application claims priority to Taiwan Application Serial Number, 104144713, filed Dec. 31, 2015, which is herein incorporated by reference.

BACKGROUND

Technical Field

The present disclosure relates to a transmitter. More particularly, the present disclosure relates to a transmitter with an elimination mechanism of a pulling effect and an eliminating method thereof.

Description of Related Art

In various wireless communication systems, a transmitter can modulate the frequency, by using an oscillating signal generated from an oscillator, to generate a radio frequency signal that is suit for the wireless communication. However, as the sizes of transmitters become smaller and smaller, such radio frequency signals may be incidentally coupled back to the oscillator. As a result, a phase error may be introduced into the oscillating signal, and thus the overall performance of the transmitter is reduced. The aforementioned phenomenon is commonly known as the "pulling effect."

In some approaches, the calibration mechanism for eliminating the pulling effect is arranged subsequent to a mixer. As a result, the required bandwidth for such calibration mechanism may be too high. The cost and complexity of the transmitter are thus increased. In some other approaches, a calibration circuit for eliminating the pulling effect is arranged in a phase locked loop. As a result, unwanted phase noise may be introduced to reduce the performance of the transmitter.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
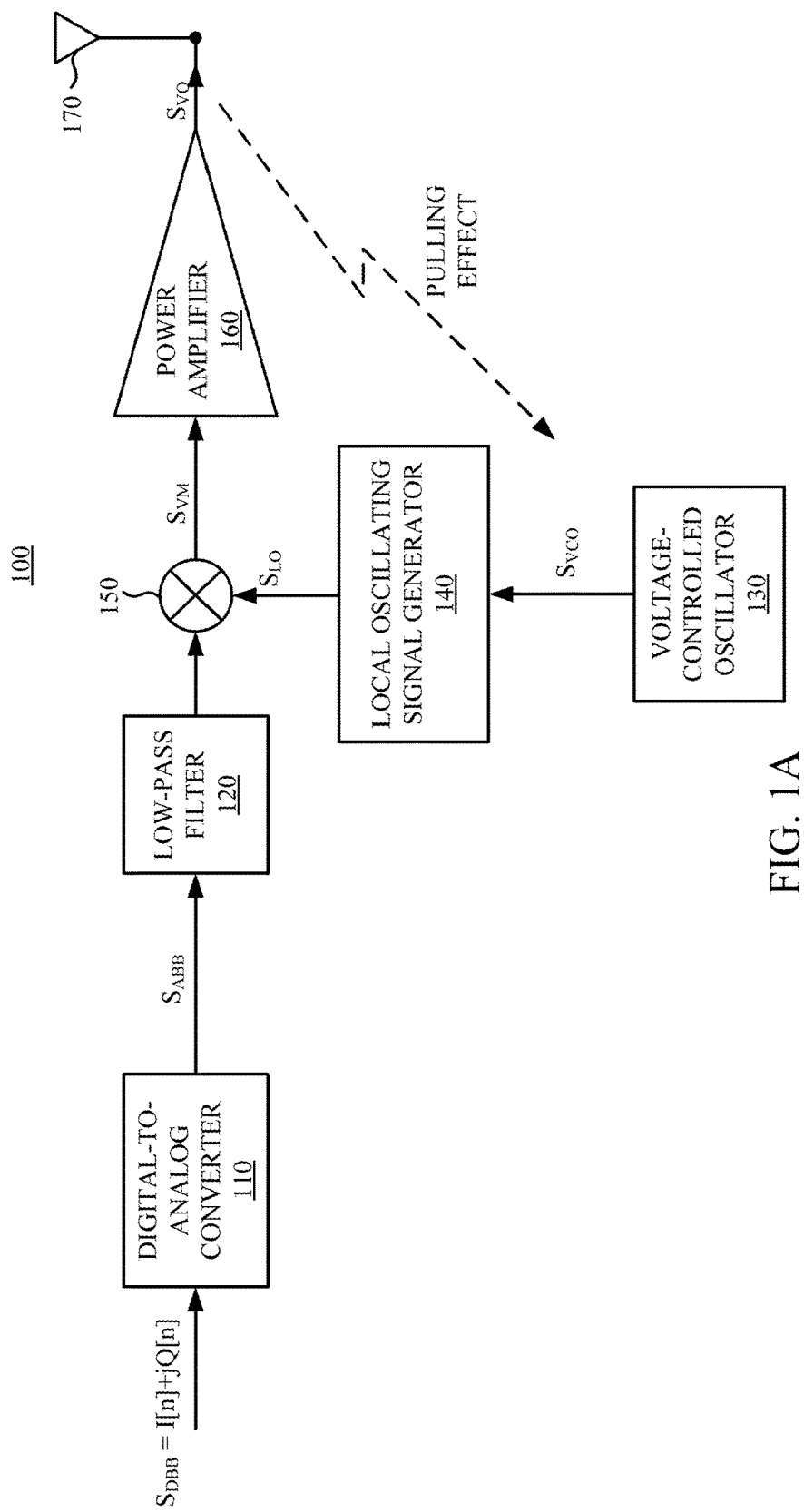
FIG. 1A is a schematic diagram of some embodiments of a transmitter in the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "signal A(t)" indicates a continuous signal in a form of the analog signal, "signal A[n]" indicates a discrete signal in a form of the digital signal, and corresponds to the signal A(t). For example, the signal A[n] can be converted, by a digital-to-analog converter, to the corresponding signal A(t). Similarly, in some other embodiments, the signal A(t) can be converted, by an analog-to-digital converter, to the corresponding signal A[n].

FIG. 1A is a schematic diagram of some embodiments of a transmitter in the present disclosure.

A digital-to-analog converter (DAC) 110 receives a baseband signal $S_{DBB}$, and generates a corresponding analog signal $S_{ABB}$ according to the baseband signal $S_{DBB}$. A low pass filter 120 removes the images, which are introduced from the digital-to-analog transformation, on the analog signal $S_{ABB}$. A voltage-controlled oscillator (VCO) 130 generates an oscillating signal $S_{VCO}$ having a frequency $f_{vco}$ to a local oscillating signal generator 140. The local oscillating signal generator 140 thus divides the oscillating signal $S_{VCO}$ to generate a local oscillating signal $S_{LO}$ having a local frequency $f_{LO}$ to a mixer 150. The mixer 150 upconverts the filtered analog signal $S_{ABB}$ according to the oscillating signal $S_{LO}$, to output a modulation signal $S_{VM}$. A power amplifier 160 amplifies the power of the modulation signal $S_{VM}$ to generate an output signal $S_{VO}$. An antenna 170 emits the output signal $S_{VO}$. The output signal $S_{VO}$ can be expressed as the following equation (1) in the time domain:

$$S_{VO}=GA_{BB}(t)\cos(\omega_{LO}t+\theta_{BB}(t)+\sigma) \quad (1).$$

In the equation (1), G is an overall gain of the transmitter 100, $A_{BB}(t)$ is the amplitude of the analog signal $S_{ABB}$, $\omega_{LO}$ is a radian frequency corresponding to the local frequency $f_{LO}$, $\theta_{BB}(t)$ is the phase of the analog signal $S_{ABB}$, and $\sigma$ is an additional phase introduced during the baseband signal $S_{DBB}$ passes the transmitter 100.

When the pulling effect is present in the VCO 130, the output signal $S_{VO}$ is able to be amended as the following equation (2):

$$S_{VO}=GA_{BB}(t)\cos(\omega_{LO}t+\theta_{BB}(t)+\sigma+\theta(t)) \quad (2),$$

where $\theta(t)$ is the phase error introduced from the pulling effect. If it is assumed that the additional phase $\sigma$ is 0, and the gain G of the transmitter 100 is 1, the output signal $S_{VO}$ can be further simplified as the following equation (3):

$$S_{VO}=A_{BB}(t)\cos(\omega_{LO}t+\theta_{BB}(t)+\theta(t)) \quad (3).$$

The equation (3) is expanded to obtain the following equation (4):

$$\begin{aligned}S_{VO}=&[A_{BB}(t)\cos(\theta_{BB}(t))\cos(\theta(t))\cos(\omega_{LO}t)]+[A_{BB}(t)\sin(\theta_{BB}(t))\cos(\theta(t))(-\sin(\omega_{LO}t))]+[A_{BB}(t)\cos(\theta_{BB}(t))\sin(\theta(t))(-\sin(\omega_{LO}t))]-[A_{BB}(t)\sin(\theta_{BB}(t))\sin(\theta(t))\\&(\cos(\omega_{LO}t)]=[I(t)\cos(\theta(t))\cos(\omega_{LO}t)+Q(t)\cos(\theta(t))(-\sin(\omega_{LO}t))]+[I(t)\sin(\theta(t))(-\sin(\omega_{LO}t))-Q(t)\sin(\theta(t))(\cos(\omega_{LO}t))]\end{aligned} \quad (4)$$

where $I(t)=S_{ABB}(t)\cos(\theta_{BB}(t))$, and I(t) is an in-phase data signal corresponding to the baseband signal $S_{DBB}$. $Q(t)=S_{ABB}(t)\sin(\theta_{BB}(t))$ and Q(t) is a quadrature data signal corresponding to the baseband signal $S_{DBB}$.

Figure 1B:
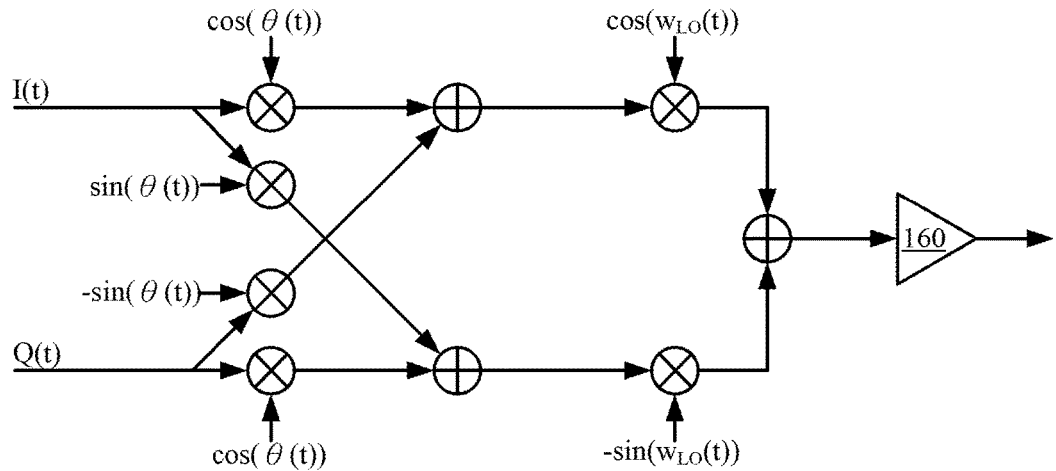
FIG. 1B is a schematic diagram illustrating a mathematical model, for the transmitter in FIG. 1A occurring a pulling effect, in the time domain.

FIG. 1B is a schematic diagram illustrating a mathematical model, for the transmitter 100 occurring the pulling effect, in the time domain.

Figure 1C:
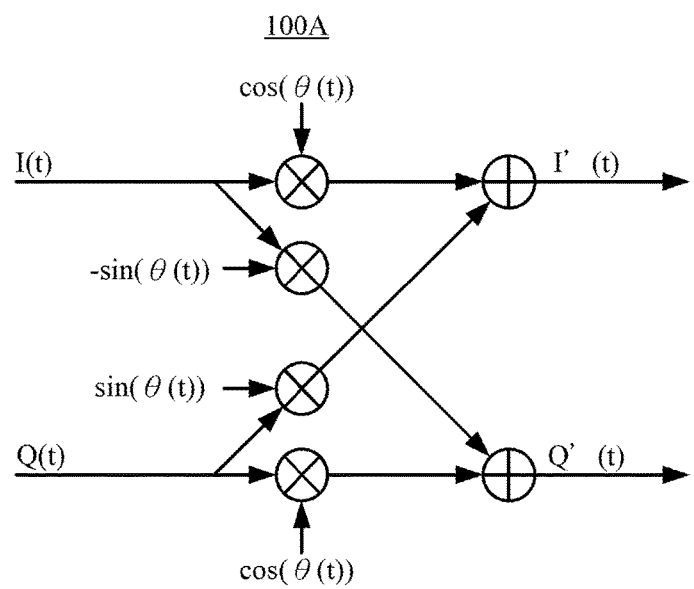
FIG. 1C is a schematic diagram illustrating a mathematical model of a correction matrix for eliminating the pulling effect.

FIG. 1C is a schematic diagram illustrating a mathematical model of a correction matrix for eliminating the pulling effect. With the mathematical model illustrated in FIG. 1B, the present disclosure provides a correction method for eliminating the pulling effect as described as follows.

In some embodiments, before being mixed, the analog signal $S_{ABB}$ can be calibrated with the correction matrix 100A in FIG. 1C, to eliminate the phase error θ(t) introduced from the pulling effect. According to the respective mathematical models illustrated in FIG. 1B and FIG. 1C, it can be obtained that the in-phase data signal I(t) and the quadrature data signal Q(t) are satisfied with the following equation (5):

$$\begin{bmatrix} I(t) \\ Q(t) \end{bmatrix} = \begin{bmatrix} \cos((t)) & -\sin((t)) \\ \sin((t)) & \cos((t)) \end{bmatrix} \begin{bmatrix} \cos((t)) & \sin((t)) \\ -\sin((t)) & \cos((t)) \end{bmatrix} \begin{bmatrix} I(t) \\ Q(t) \end{bmatrix}. \quad (5)$$

Thus, according to the equation (5), the analog signal $S_{ABB}$ is pre-processed by the correction matrix 100A to eliminate the phase error θ(t) introduced from the pulling effect. Explained in a different way, if the equation (5) is expressed as in a form of the complex function, as the following equation (6):

$$I'(t)+jQ'(t)=[I(t)+Q(t)]e^{[-j\theta(t)]}=[I(t)+Q(t)][\alpha(t)+j\beta(t)] \quad (6)$$

where I'(t)+jQ'(t) is a correction signal, which is generated from processing of the correction matrix 100A, a phase correction signal α(t) is cos(θ(t)), and a phase correction signal β(t) is −sin(θ(t)). Effectively, by using the correction matrix 100A to pre-process the analog signal $S_{ABB}$, a pre-phase correction signal φ(t) is able to be generated, in which φ(t)=−θ(t). As a result, when the correction signal I'(t)+jQ'(t) is mixed through the mixer 150, the pre-phase correction signal φ(t) and the phase error θ(t) are canceled out each other. Accordingly, the impact of the pulling effect is thus eliminated.

Figure 2:
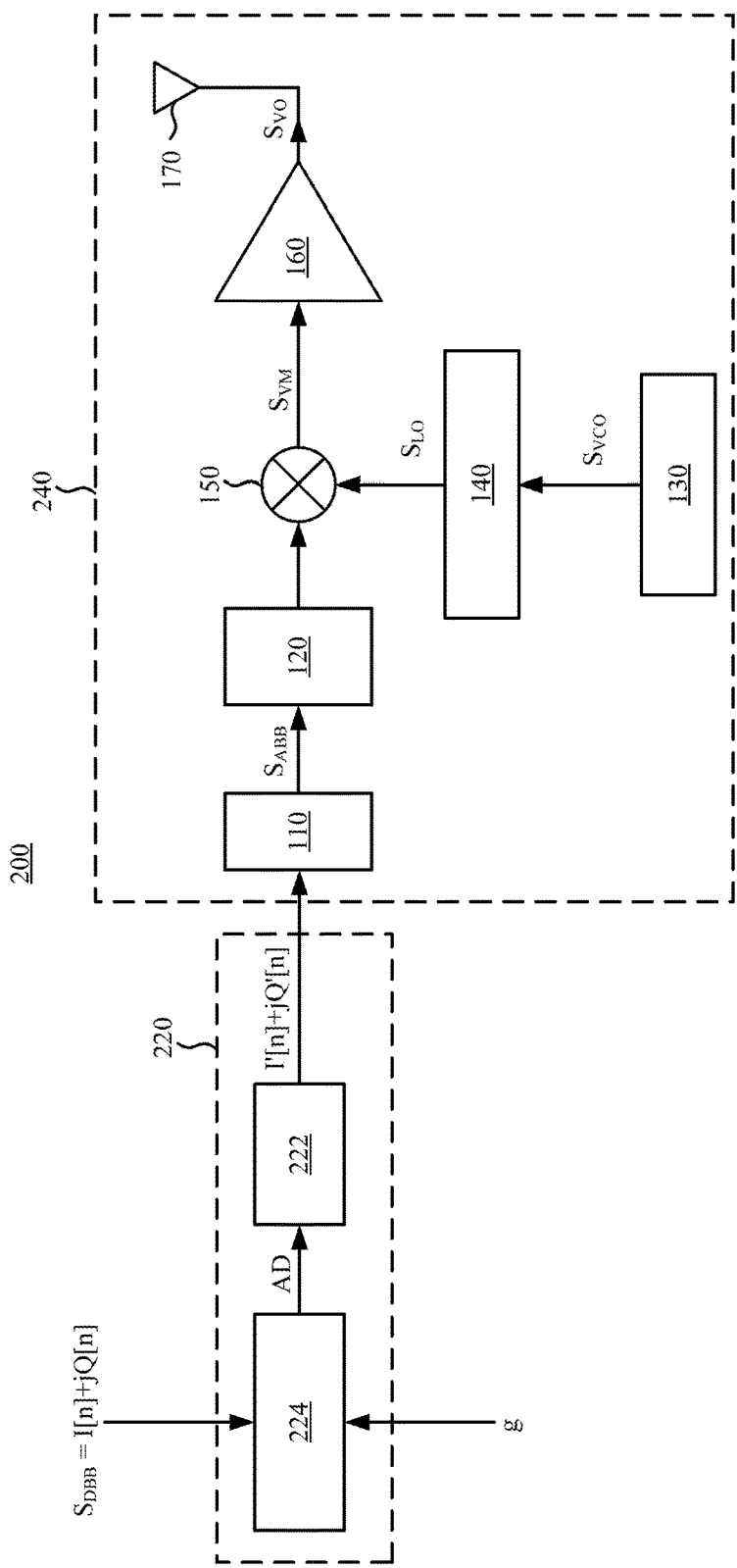
FIG. 2 is a schematic diagram of a transmitter in accordance with some embodiments of the present disclosure.

FIG. 2 is a schematic diagram of a transmitter in accordance with some embodiments of the present disclosure. As shown in FIG. 2, the transmitter 200 includes a correction unit 220 and an output unit 240. The output unit 240 includes the DAC 110, the low pass filter 120, the VCO 130, the local oscillating signal generator 140, the mixer 150, the power amplifier 160, and the antenna 170, as mentioned in FIG. 1A above. The repetitious descriptions regarding related functions and operations of the output unit 240 are thus not given here.

The correction unit 220 includes a memory circuit 222 and an address generation circuit 224. The memory circuit 222 may be a register or a random access memory. The memory circuit 222 stores at least one look up table, which stores correction data corresponding to the in-phase data signal I[n], the quadrature data signal Q[n], and a least one parameter g.

With reference to the related descriptions and FIG. 3 of a reference document (Pulling Mitigation in Wireless Transmitters IEEE JSSC vol. 49, NO. 9, September 2014.), the phase error θ(t) is related to the baseband signal $S_{DBB}$. The analog signal $S_{ABB}$, which the baseband signal $S_{DBB}$ corresponds to, is able to be linearly superposed of the in-phase data signal I(t) and the quadrature data signal Q(t). In other words, $S_{ABB}$=I(t)+jQ(t). According to FIG. 3 of the reference document and the equation (6), the pre-phase correction signal φ(t) can be expressed as the following equation (7) after the coordinate transformation:

$$\varphi[n]=C1(I^2[N]-Q^2[N])+C2(2I[n]Q[n]) \quad (7).$$

In the equation (7), the coefficients C1 and C2 are related to the system parameter g (e.g., the output power of the power amplifier 160 and the operating temperature of the transmitter 200). Thus, according to the equations (6) and (7) above, different system parameters g, the in-phase data signal I[n], and the quadrature data signal Q[n] can be calculated or a desired correction signal I'[n]+jQ'[n] may be measured in advance, in order to be stored as the aforementioned correction data. The detailed descriptions regarding the correction data will be provided in paragraphs below.

The address generation circuit 224 generates a corresponding address AD according to the in-phase data signal I[n], the quadrature data signal Q[n], and the system parameters g, so as to search the correction data from the look up table, and then output the correction signal I'[n]+jQ'[n] to the output unit 240.

The following paragraphs provide various embodiments to illustrate functions and applications of the equation (7). It is noted that, for clearer illustration, drawings of following embodiments are presented in a form of the complex function to described relationships between the baseband signal $S_{DBB}$, i.e., I[n]+jQ[n], and each circuit. A person skilled in the art might adjust the implementations of the correction unit 220 according to each drawing, and thus the present disclosure is not limited to the following embodiments.

Figure 3A:
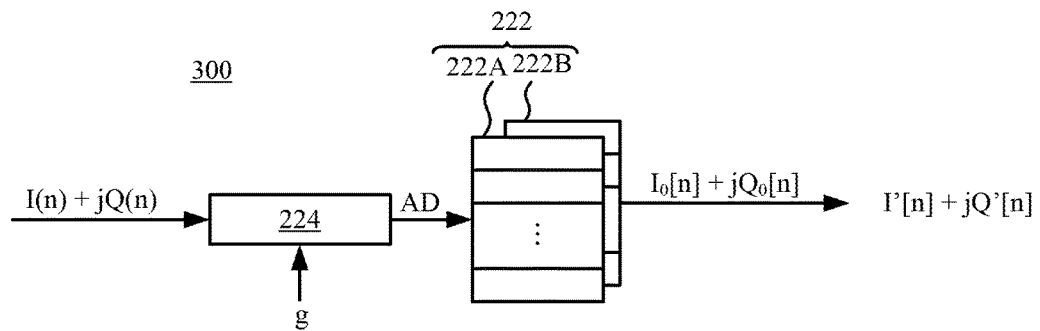
FIG. 3A is a schematic diagram of some embodiments of a correction unit.

FIG. 3A is a schematic diagram of some embodiments of the correction unit. As shown in FIG. 3A, in this example, the memory circuit 222 stores a look up table 222A and a look up table 222B. The correction data of the look table 222A store predetermined in-phase data values $I_0[n]$ and the correction data of the look table 222B store predetermined quadrature data values $Q_0[n]$. The address generation circuit 224 generates the corresponding address according the currently-received in-phase data signal I[n] and quadrature data signal Q[n], and the system parameter g, so as to select a corresponding in-phase data value $I_0[n]$ and a corresponding quadrature data value $Q_0[n]$ from the look up tables 222A and 222B, respectively. Accordingly, a corresponding compensation signal $I_0[n]+jQ_0[n]$ is generated to be output as the correction signal I'[n]+jQ'[n] to the output unit 240.

Effectively, in this example, with a calculation of the equation (6) in advance, the correction data of the memory circuit 222 stores multiple groups of the predetermined compensation signals $I_0[n]+jQ_0[n]$. The address generation circuit 224 may select a corresponding one group of compensation signal $I_0[n]+jQ_0[n]$, and output the same as the correction signal I'[n]+jQ'[n].

Figure 3B:
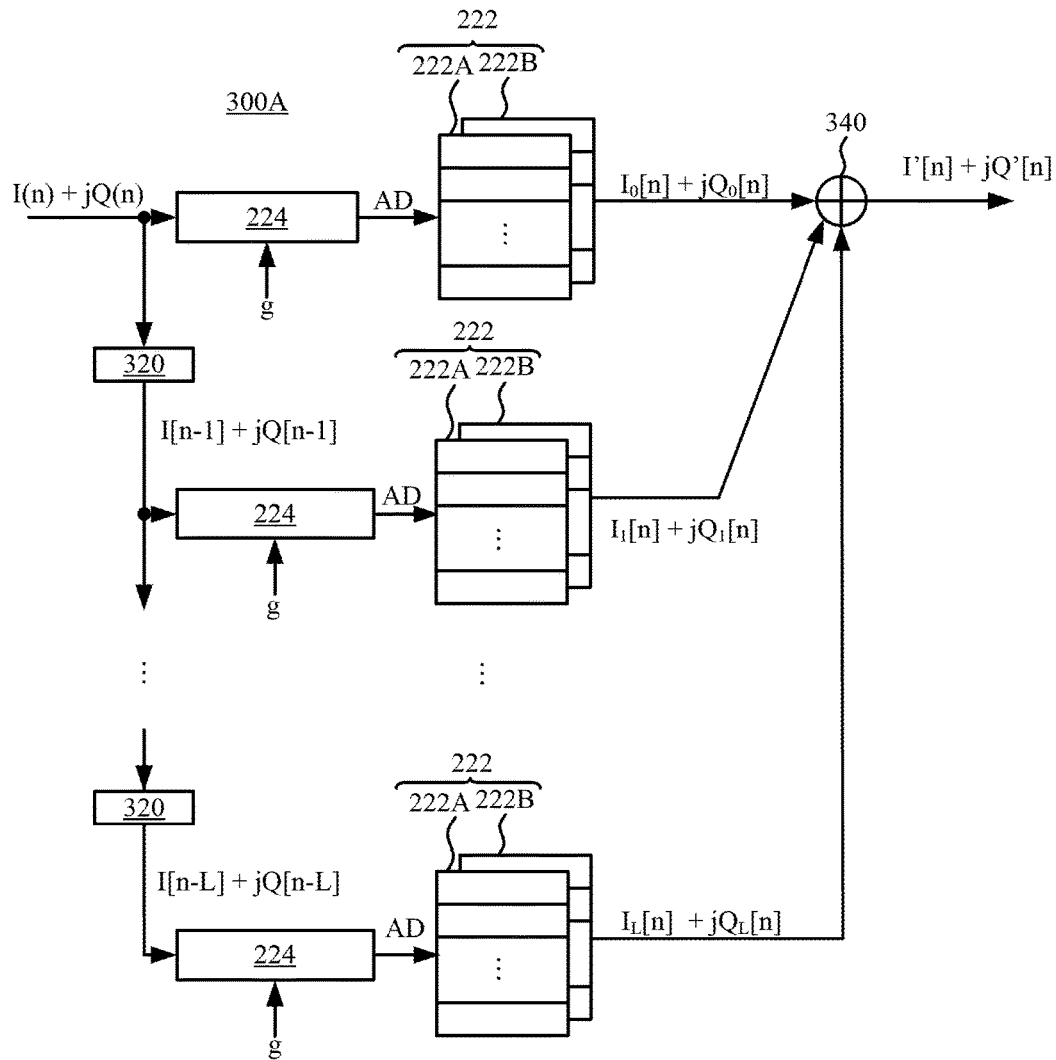
FIG. 3B is a schematic diagram of some other embodiments of the correction unit.

FIG. 3B is a schematic diagram of some other embodiments of the correction unit 300A. The correction unit 300A further includes delay circuits 320, address generation circuits 224, look up tables 222A and 222B, and an adder 340.

As shown in FIG. 3B, the delay circuits 320 are coupled in series to sequentially output previous in-phase data signals I[n−1]–I[n−L] and previous quadrature data signals Q[n−1]–Q[n−L] according to the in-phase data signal I[n] and the quadrature data signal Q[n]. The address generation circuits 224 receive previous baseband signals I[n−1]+jQ[n−1]–I[n−L]+jQ[n−L], respectively. Accordingly, each of the address generation circuits 224 is able to generate a corresponding address AD according to the received baseband signal I[n]+jQ[n] or the previous baseband signals I[n−1]+jQ[n−1]–I[n−L]+jQ[n−L], so as to select the compensation signals $I_0[n]+jQ_0[n]$–$I_L[n]+jQ_L[n]$ from the corresponding look up tables 222A and 222B. The adder 340 sums up the compensation signals $I_0[n]+jQ_0[n]$–$I_L[n]+jQ_L[n]$ to generate the correction signal I'[n]+Q'[n].

Compared to FIG. 3A, an impact of memory effect in a wideband system is further taken into account via the correction unit 300A. By utilizing multiple groups of the look up tables 222A and 222B, which correspond to the baseband signal received at pervious L times, the correction unit 300A can eliminate the total phase error introduced in the previous L times of the VCO 130. As a result, the performance of the transmitter 200 can be further improved.

Figure 4:
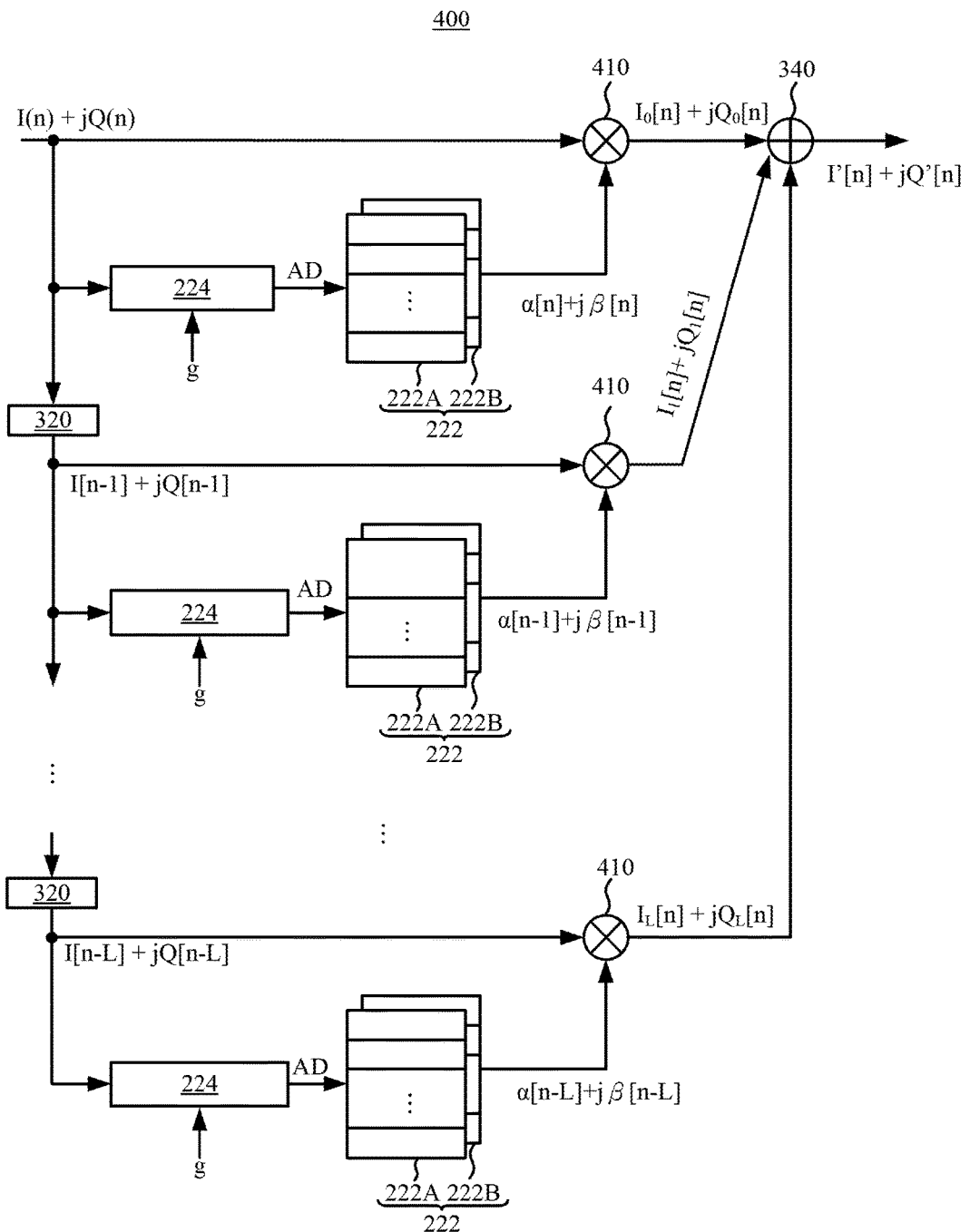
FIG. 4 is a schematic diagram of some other embodiments of the correction unit.

FIG. 4 is a schematic diagram of some other embodiments of a correction unit 400. Compared with FIG. 3B, the correction unit 400 further includes multipliers 410. In this example, the correction data of the look up table 222A store predetermined phase correction signals $\alpha[n]-\alpha[n-L]$, respectively. The correction data of the look up tables 222B store predetermined phase correction data signals $\beta[n]-\beta[n-L]$, respectively. Accordingly, the address generation circuits 224 generate corresponding addresses AD according to the received baseband signal $I[n]+jQ[n]$, the previous baseband signals $I[n-1]+jQ[n-1]-I[n-L]+jQ[n-L]$, and the system parameter g, to select the corresponding phase correction signals $\alpha[n]-\alpha[n-L]$ and $\beta[n]-\beta[n-L]$ from the corresponding look up tables 222A and 222B. The pre-compensation signals $\alpha[n]+j\beta[n]-\alpha[n-L]+j\beta[n-L]$ are then outputted from the corresponding look up tables 222A and 222B. The multipliers 410 multiply the baseband signal $I[n]+jQ[n]$ with the pre-compensation signal $\alpha[n]+j\beta[n]$, and multiply the previous baseband signal $I[n-1]+jQ[n-1]-I[n-L]+jQ[n-L]$ with the pre-compensation signals $\alpha[n-1]+jp[n-1]-\alpha[n-L]+jp[n-L]$ respectively to generate the compensation signals $I_0[n]+jQ_0[n]-I_L[n]+jQ_L[n]$. The adder 340 sums up the compensation signals $I_0[n]+jQ_0[n]-I_L[n]+jQ_L[n]$ to generate the correction signal $I'[n]+jQ'[n]$.

In some embodiments, the correction unit 400 may also utilize the arrangement illustrated in FIG. 3A. In other words, with a single multiplier 410, a signal address generation circuit 224, a single look up table 222A and 222B, the compensation signal $I_0[n]+jQ_0[n]$ is generated according to the baseband signal $I[n]+jQ[n]$, and is output as the correction signal $I'[n]+jQ'[n]$ to the output unit 240. The descriptions of the related operations are similar with the paragraphs above, and thus the repetitious descriptions are not given here.

Figure 5A:
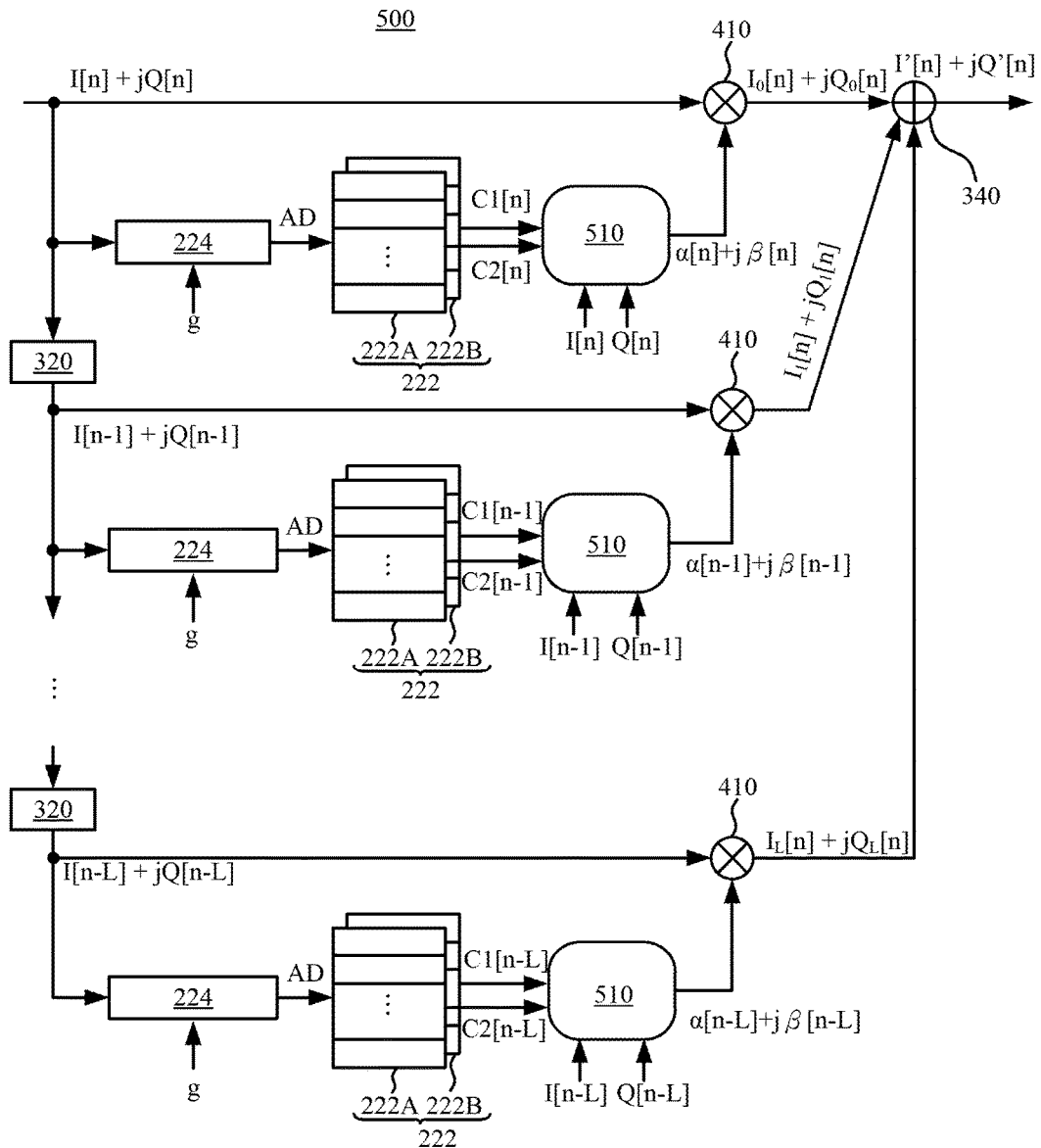
FIG. 5A is a schematic diagram of some yet another embodiments of the correction unit.

FIG. 5A is a schematic diagram of some yet another embodiments of a correction unit 500. Compared with FIG. 4, the correction unit 500 further includes correction calculation circuits 510. The look up tables 222A of the correction unit 500 store predetermined coefficients $C1[n]-C1[n-L]$, and the look up tables 222B store predetermined coefficients $C2[n]-C2[n-L]$. The address generation circuits 224 generate corresponding addresses AD according to the received baseband signal $I[n]+jQ[n]$, the previous baseband signals $I[n-1]+jQ[n-1]-I[n-L]+jQ[n-L]$, and the system parameter g, to select the corresponding coefficients $C1[n]-C1[n-L]$ and $C2[n]-C2[n-L]$ from the corresponding look up tables 222A and 222B. Thus, the correction calculation circuits 510 are able to generate pre-compensation signals $\alpha[n]+j\beta[n]-\alpha[n-L]+j\beta[n-L]$. The multipliers 410 multiply the baseband signal $I[n]+jQ[n]$ with the pre-compensation signal $\alpha[n]+j\beta[n]$, and multiply the previous baseband signal $I[n-1]+jQ[n-1]-I[n-L]+jQ[n-L]$ with the pre-compensation signals $\alpha[n-1]+j\beta[n-1]-\alpha[n-L]+jp[n-L]$ respectively to generate the compensation signals $I_0[n]+jQ_0[n]-I_L[n]+jQ_L[n]$. The adder 340 sums up the compensation signals $I_0[n]+jQ_0[n]-I_L[n]+jQ_L[n]$ to generate the correction signal $I'[n]+jQ'[n]$.

In some other embodiments, the correction unit 500 may also utilize the arrangement illustrated in FIG. 3A. In other words, with a single multiplier 410, a correction calculation circuit 510, a single address generation circuit 224, a single look up table 222A and 222B, the compensation signal $I_0[n]+jQ_0[n]$ is generated according to the baseband signal $I[n]+jQ[n]$, and is output as the correction signal $I'[n]+jQ'[n]$ to the output unit 240. The descriptions of the related operations are similar with the paragraphs above, and thus the repetitious descriptions are not given here.

Figure 5B:
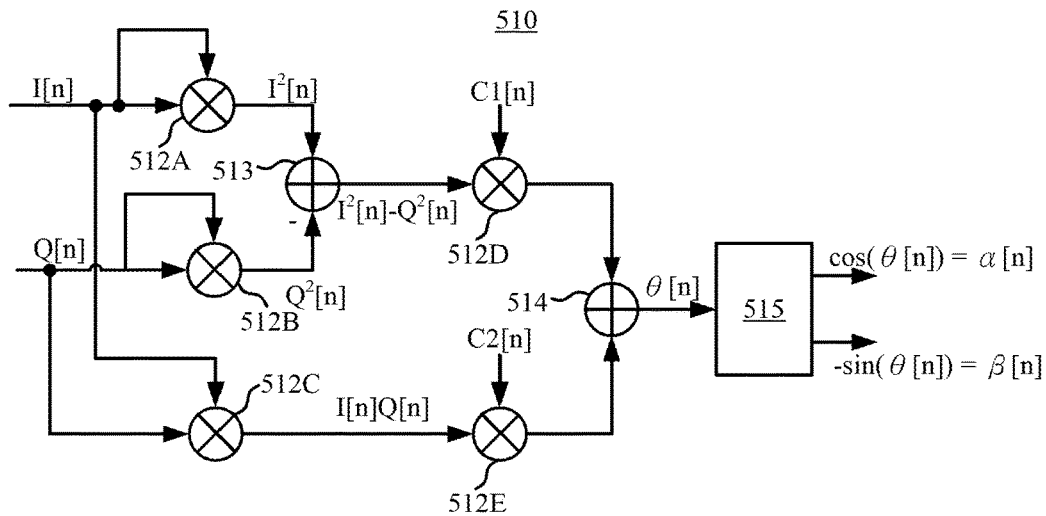
FIG. 5B is a schematic diagram of some embodiments of a correction calculation circuit.

FIG. 5B is a schematic diagram of some embodiments of the correction calculation circuit 510. As shown in FIG. 5B, the correction calculation circuit 510 includes multipliers 512A-512E, a subtractor 513, an adder 514, and a coordinate converter 515.

The multiplier 512A multiplies the in-phase data signal $I[n]$ by the square, to generate an operation value $I^2[n]$. The multiplier 512B multiplies the quadrature data signal $Q[n]$ by the square, to generate an operation value $Q^2[n]$. The multiplier 512C multiplies the in-phase data signal $I[n]$ with the quadrature data signal $Q[n]$, to generate an operation value $I[n]Q[n]$. The subtractor 513 subtracts the operation value $Q^2[n]$ from the operation value $I^2[n]$ to generate an operation value $I^2[n]-Q^2[n]$. The multiplier 512D multiplies the operation value $I^2[n]-Q^2[n]$ with the coefficient $C1[n]$ to generate an operation value $C1[n]*(I^2[n]-Q^2[n])$. The multiplier 512E multiplies the operation value $I[n]Q[n]$ with the coefficient $C2[n]$ to generate an operation value $C2[n]*(I[n]Q[n])$. The adder 514 sums up the operation value $C1[n]*(I^2[n]-Q^2[n])$ and the operation value $C2[n]*(I[n]Q[n])$ to generate a phase error value $\theta[n]$. The coordinate converter 515 performs a coordinate conversion according to the phase error value $\theta[n]$ to generate phase correction signals $\alpha[n]$ and $\beta[n]$, in which $\alpha[n]=\cos(\theta[n])$, and $\beta[n]=-\sin(\theta[n])$.

Effectively, in this embodiment, the correction calculation circuit 510 may sequentially calculate required parameters for composing the final output correction signal $I'(t)+jQ'(t)$ according to the equations (6) and (7) above.

Figure 6A:
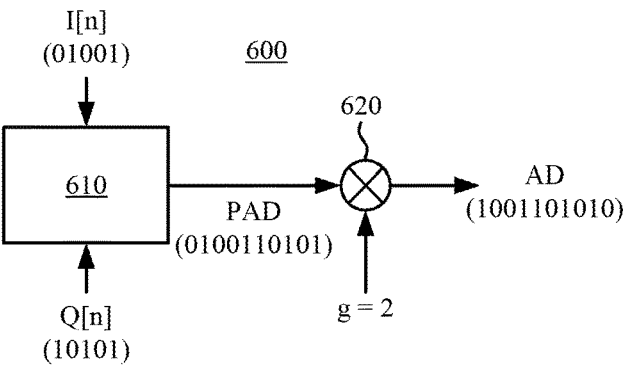
FIG. 6A is a schematic diagram of some embodiments of an address generation circuit.

FIG. 6A is a schematic diagram of some embodiments of an address generation circuit 600. As shown in FIG. 6A, the address generation circuit 600 includes a data merger 610 and a multiplier 620. The data merger 610 merges the in-phase data signal $I[n]$ with the quadrature data signal $Q[n]$ to generate a pre-address code PAD. The multiplier 620 multiplies the pre-address code PAD with the system parameter g to output the address AD.

For example, both of the in-phase data signal $I[n]$ and the quadrature data signal $Q[n]$ are 5-bit digital data, and the system parameter is 2 (e.g., the gain of the transmitter is set to 2). The bit values of the in-phase data signal $I[n]$ are "01001," and the bit values of the quadrature data signal $Q[n]$ are "10101." The data merger 610 then combines the in-phase data signal $I[n]$ with the quadrature data signal $Q[n]$ to generate a 10-bit pre-address code PAD, of which the bit values are "0100110101." The multipliers thus outputs 10-bit address AD, of which the bit values are "1001101010."

Figure 6B:
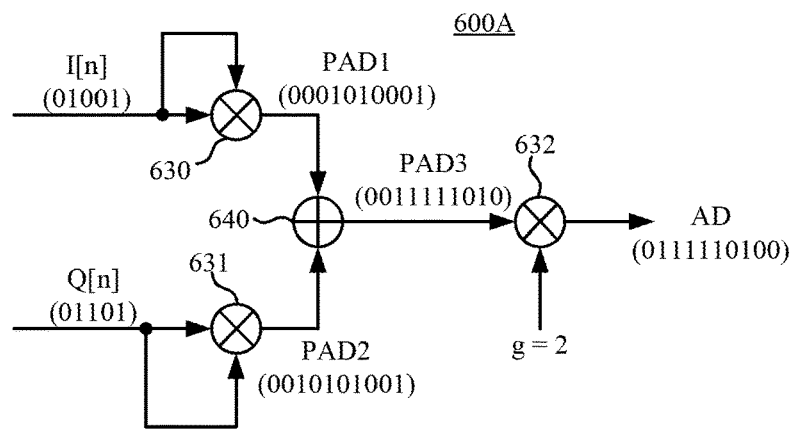
FIG. 6B is a schematic diagram of some embodiments of an address generation circuit.

FIG. 6B is a schematic diagram of some embodiments of an address generation circuit 600A. As shown in FIG. 6B, the address generation circuit 600A includes multipliers 630-632 and an adder 640. The multiplier 630 multiplies the in-phase data signal $I[n]$ by the square to generate a pre-address code PAD1. The multiplier 631 multiplies the quadrature data signal $Q[n]$ to generate by the square to generate a pre-address code PAD2. The adder 640 sums up the pre-address code PAD1 and pre-address code PAD2 to generate a pre-address code PAD3. The multiplier 640 multiplies the pre-address code PAD3 with the system parameter g to output the address AD.

For example, both of the in-phase data signal I[n] and the quadrature data signal Q[n] are 5-bit digital data, and the system parameter is 2 (e.g., the gain of the transmitter is set to 2). The bit values of the in-phase data signal I[n] are "01001," and the bit values of the quadrature data signal Q[n] are "10101." Accordingly, the multiplier 630 generates a 10-bit pre-address code PAD1, of which the bit values are "0001010001." The multiplier 631 generates a 10-bit pre-address code PAD2, of which the bit values are "0010101001." The adder 640 sums up the pre-address codes PAD1-PAD2 to generate the pre-address code PAD3, of which the bit values are "0011111010." The multiplier 632 then outputs a 10-bit address AD, of which the bit values are "0111110100." FIG. 6A and FIG. 6B are given for illustrative purposes only, various types of encoder circuit, which are able to implement the address generation circuit 224, are within the contemplated scope of the present disclosure.

As discussed above, the transmitter provided in the present disclosure utilizes different arrangements to preset multiple groups of loop up tables, in order to eliminate introduced from a pulling effect according to the system operating status of the transmitter and the received baseband signal. As a result, the system performance of the transmitter and the data accuracy may be improved.

It will be apparent to those skilled in the art that various modifications and variations can be made to the structure of the present disclosure without departing from the scope or spirit of the disclosure. In view of the foregoing, it is intended that the present disclosure cover modifications and variations of this invention provided they fall within the scope of the following claims.

What is claimed is:

1. A transmitter, comprising:
   a correction unit comprising:
      a memory circuit configured to store a look up table, wherein the look up table stores correction data corresponding to an in-phase data signal, a quadrature data signal, and at least one system parameter; and
      a first address generation circuit configured to process the in-phase data signal and the quadrature data signal to generate at least one pre-address code and to multiply the at least one pre-address code with the at least one system parameter to generate a first address, in order to output a correction signal via the correction data; and
   an output unit configured to modulate the correction signal according to an oscillating signal to generate a modulated signal, and amplify the modulated signal to generate an output signal.

2. The transmitter of claim 1, wherein the correction data comprise information of a plurality of first compensation signals, and the first address generation circuit is configured to select a corresponding one of the first compensation signals from the look up table according to the first address, to output the same as the correction signal.

3. The transmitter of claim 2, wherein the look up table is further configured to store information of a plurality of second compensation signals corresponding to a previous in-phase data signal, a previous quadrature data signal, and the at least one system parameter, and the correction unit further comprises:
   a delay circuit configured to delay the in-phase data signal and the quadrature data signal to generate the previous in-phase data signal and the previous quadrature data signal;
   a second address generation circuit configured to generate a second address according to the previous in-phase data signal, the previous quadrature data signal, and the at least one system parameter, in order to select a corresponding one of the second compensation signals from the look up table; and
   an adder configured to sum up the corresponding one of the first compensation signals and the corresponding one of the second compensation signals to generate the correction signal.

4. The transmitter of claim 1, wherein the correction data comprise information of a plurality of first phase correction signals and information of a plurality of second phase correction signals, the first address generation circuit is further configured to select a corresponding one of the first phase correction signals and a corresponding one of the second phase correction signals from the look up table, and the correction unit further comprises:
   a first multiplier configured multiply a baseband signal with a first pre-compensation signal to generate a first compensation signal, and output the same as the correction signal;
   wherein the baseband signal indicates a complex function associated with the in-phase data signal and the quadrature data signal, and the first pre-compensation signal indicates a complex function associated with the corresponding one of the first phase correction signals and the corresponding one of the second phase correction signals.

5. The transmitter of claim 4, wherein the look up table is further configured to store information of a plurality of third phase correction signals and information of a plurality of fourth phase correction signals, and the correction unit further comprises:
   a delay circuit configured to delay the in-phase data signal and the quadrature data signal to generate a previous in-phase data signal and a previous quadrature data signal;
   a second address generation circuit configured to generate a second address according to the previous in-phase data signal, the previous quadrature data signal, and the at least one system parameter, to select a corresponding one of the third phase correction signals and a corresponding one of the fourth phase correction signals;
   a second multiplier configured to multiply a previous baseband signal with a second pre-compensation signal, to generate a second compensation signal; and
   an adder configured to sum up the first compensation signal and the second compensation signal, to generate the correction signal;
   wherein the previous baseband signal indicates a complex function associated with the previous baseband in-phase data signal and the previous quadrature data signal, and the second pre-compensation signal indicates a complex function associated with the corresponding one of the third phase correction signals and the corresponding one of the fourth phase correction signals.

6. The transmitter of claim 1, wherein the correction data comprise information of a plurality of first coefficients and information of a plurality of second coefficients, the first address generation circuit is configured to select a corresponding one of the first coefficients and a corresponding one of the second coefficients from the look up table according to the first address, and the correction unit further comprises:

a first correction calculation circuit configured to generate a first phase correction signal and a second phase correction signal according to the corresponding one of the first coefficients, the corresponding one of the second coefficients, the in-phase data signal, and the quadrature data signal; and a first multiplier configured to multiply a baseband signal and a first pre-compensation signal to generate a first compensation signal, and output the same as the correction signal;

wherein the baseband signal indicates a complex function associated with the in-phase data signal and the quadrature data signal, and the first pre-compensation signal indicates a complex function associated with the first phase correction signal and the second phase correction signal.

7. The transmitter of claim 6, wherein the correction data further comprise information of a plurality of third coefficients and information of a plurality of fourth coefficients, and the correction unit further comprises:

a delay circuit configured to delay the in-phase data signal and the quadrature data signal to generate a previous in-phase data signal and a previous quadrature data signal;

a second address generation circuit configured to generate a second address according to the previous in-phase data signal, the previous quadrature data signal, and the at least one system parameter, to select a corresponding one of the third coefficients and a corresponding one of the fourth coefficients;

a second correction calculation circuit configured to generate a third phase correction signal and a fourth phase correction signal according to the corresponding one of the third coefficients, the corresponding one of the fourth coefficients, the previous in-phase data signal, and the previous quadrature data signal;

a second multiplier configured to multiply a previous baseband signal with a second pre-compensation signal to generate a second compensation signal, wherein the previous baseband signal indicates a complex function associated with the previous in-phase data signal and the previous quadrature data signal, and the second pre-compensation signal indicates a complex function associated with the third phase correction signal and the fourth phase correction signal; and an adder configured to sum up the first compensation signal and the second compensation signal, to generate the correction signal.

8. The transmitter of claim 6, wherein the first correction calculation circuit comprises:

a second multiplier configured to multiply the in-phase data signal by the square, to generate a first operation value;

a third multiplier configured to multiply the quadrature data signal by the square, to generate a second operation value;

a fourth multiplier configured to multiply the in-phase data signal with the quadrature data signal, to generate a third operation value;

a subtractor configured to subtract the second operation value from the first operation value, to generate a fourth operation value;

a fifth multiplier configured to multiply the fourth operation value with the corresponding one of the first coefficients, to generate a fifth operation value;

a sixth multiplier configured to multiply third operation value with the corresponding one of the second coefficients to generate a sixth operation value;

an adder configured to sum up the fifth operation value with the sixth operation value, to generate a phase error value; and a coordinate converter configured to generate the first phase correction signal and the second phase correction signal according to the phase error value.

9. The transmitter of claim 1, wherein the first address generation circuit comprises:

a data merger configured to merge the in-phase data signal with the quadrature data signal, to generate a first pre-address code of the at least one pre-address code; and a multiplier configured to multiply the first pre-address code with the at least one system parameter to generate the first address.

10. The transmitter of claim 1, wherein the first address generation circuit comprises:

a first multiplier configured to multiply the in-phase data signal by the square, to generate a first pre-address code of the at least one pre-address code;

a second multiplier configured to multiply the quadrature data signal by the square, to generate a second pre-address code of the at least one pre-address code;

an adder configured to sum up the first pre-address code and the second pre-address code to generate a third pre-address code of the at least one pre-address code; and a third multiplier configured to multiply the third pre-address code with the at least one system parameter to generate the first address.

11. A correction method, comprising:

storing correction data to a memory, wherein the correction data are associated with an in-phase data signal, a quadrature data signal, and at least one system parameter;

processing the in-phase data signal and the quadrature data signal to generate at least one pre-address code and multiplying the at least one pre-address code with the at least one system parameter to generate a first address;

selecting at least one signal from the memory according to the first address, to generate a correction signal;

modulating the correction signal according to an oscillating signal to generate a modulated signal; and amplifying the modulated signal to generate an output signal.

12. The correction method of claim ii, wherein the correction data comprises information of a plurality of first compensation signals, and the operation of generating the correction signal comprises:

selecting a corresponding one of the first compensation signals from the memory according to the first address, to output the same as the correction signal.

13. The correction method of claim 12, wherein the memory is further configured to store information of a plurality of second compensation signals corresponding to a previous in-phase data signal, a previous quadrature data signal, and the at least one system parameter, and the operation of generating the correction signal further comprises:

delaying the in-phase data signal and the quadrature data signal to generate the previous in-phase data signal and the previous quadrature data signal;

generating a second address according to the previous in-phase data signal, the previous quadrature data signal, and the at least one system parameter;

selecting a corresponding one of the second compensation signals from the memory according to the second address; and summing up the corresponding one of the first compensation signals and the corresponding one of the second compensation signals to generate the correction signal.

14. The correction method of claim 11, wherein the correction data further comprise information of a plurality of first phase correction signals and information of a plurality of second phase correction signals, and the operation of generating the correction signal comprises:

selecting a corresponding one of the first phase correction signals and a corresponding one of the second phase correction signals from the memory according to the first address;

multiplying a baseband signal with a first pre-compensation signal to generate a first compensation signal, and output the same as the correction signal;

wherein the baseband signal indicates a complex function that associated with the in-phase data signal and the quadrature data signal, and the first pre-compensation signal indicates a complex function that associated with the corresponding one of the first phase correction signals and the corresponding one of the second phase correction signals.

15. The correction method of claim 14, wherein the memory is further configured to store information of a plurality of third phase correction signals and information of a plurality of fourth phase correction signals, and the operation of generating the correction signal further comprises:

delaying the in-phase data signal and the quadrature data signal to generate a previous in-phase data signal and a previous quadrature data signal;

generating a second address according to the previous in-phase data signal, the previous quadrature data signal, and the at least one system parameter;

selecting a corresponding one of the third phase correction signals and a corresponding one of the fourth phase correction signals from the memory according to the second address;

multiplying a previous baseband signal with a second pre-compensation signal, to generate a second compensation signal; and summing up the first compensation signal and the second compensation signal, to generate the correction signal;

wherein the previous baseband signal indicates a complex function associated with the previous in-phase data signal and the previous quadrature data signal, and the second pre-compensation signal indicates a complex function associated with the corresponding one of the third phase correction signals and the corresponding one of the fourth phase correction signals.

16. The correction method of claim 11, wherein the correction data comprise information of a plurality of first coefficients and information of a plurality of second coefficients, and the operation of generating the correction signal further comprises:

selecting a corresponding one of the first coefficients and a corresponding one of the second coefficients from the memory according to the first address;

generating a first phase correction signal and a second phase correction signal according to the corresponding one of the first coefficients, the corresponding one of the second coefficients, the in-phase data signal, and the quadrature data signal; and multiplying a baseband signal and a first pre-compensation signal to generate a first compensation signal, and output the same as the correction signal;

wherein the baseband signal indicates a complex function associated with in-phase data signal and the quadrature data signal, and the first pre-compensation signal indicates a complex function associated with the first phase correction signal and the second phase correction signal.

17. The correction method of claim 16, wherein the correction data further comprise information of a plurality of third coefficients and information of a plurality of fourth coefficients, and the operation of generating the correction signal further comprises:

delaying the in-phase data signal and the quadrature data signal to generate a previous in-phase data signal and a previous quadrature data signal;

generating a second address according to the previous in-phase data signal, the previous quadrature data signal, and the at least one system parameter;

selecting a corresponding one of the third coefficients and a corresponding one of the fourth coefficients from the memory according to the second address;

generating a third phase correction signal and a fourth phase correction signal according to the corresponding one of the third coefficients, the corresponding one of the fourth coefficients, the previous in-phase data signal, and the previous quadrature data signal;

multiplying a previous baseband signal with a second pre-compensation signal to generate a second compensation signal, wherein the previous baseband signal indicates a complex function associated with the previous in-phase data signal and the previous quadrature data signal, and the second pre-compensation signal indicates a complex function associated with the third phase correction signal and the fourth phase correction signal; and summing up the first compensation signal and the second compensation signal, to generate the correction signal.

18. The correction method of claim 16, wherein the operation of generating the first phase correction signal and the second phase correction signal comprises:

multiplying the in-phase data signal by the square, to generate a first operation value;

multiplying the quadrature data signal by the square, to generate a second operation value;

multiplying the in-phase data signal with the quadrature data signal, to generate a third operation value;

subtracting the second operation value from the first operation value, to generate a fourth operation value;

multiplying the fourth operation value with the corresponding one of the first coefficients, to generate a fifth operation value;

multiplying third operation value with the corresponding one of the second coefficients to generate a sixth operation value;

sum up the fifth operation value with the sixth operation value, to generate a phase error value; and generating the first phase correction signal and the second phase correction signal according to the phase error value.

19. The correction method of claim 11, wherein the operation of processing the in-phase data signal and the quadrature data signal comprises:

merging the in-phase data signal with the quadrature data signal, to generate a first pre-address code of the at least one pre-address code; and multiplying the first pre-address code with the at least one system parameter to generate the first address.

20. The correction method of claim 11, wherein the operation of processing the in-phase data signal and the quadrature data signal comprises:

multiplying the in-phase data signal by the square, to generate a first pre-address code of the at least one pre-address code;

multiplying the quadrature data signal by the square, to generate a second pre-address code of the at least one pre-address code;

summing up the first pre-address code and the second pre-address code to generate a third pre-address code of the at least one pre-address code; and multiplying the third pre-address code with the at least one system parameter to generate the first address.

* * * * *